United States Patent
Chou et al.

(10) Patent No.: US 7,855,932 B2
(45) Date of Patent: Dec. 21, 2010

(54) LOW POWER WORD LINE CONTROL CIRCUITS WITH BOOSTED VOLTAGE OUTPUT FOR SEMICONDUCTOR MEMORY

(75) Inventors: Chung-Cheng Chou, Hsin-Chu (TW);
Chien-Hua Huang, Hsinchu (TW);
Hau-Tai Shieh, Hsinchu (TW);
Tsai-Hsin Lai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1238 days.

(21) Appl. No.: 11/264,041

(22) Filed: Oct. 31, 2005

(65) Prior Publication Data

US 2006/0203600 A1    Sep. 14, 2006

Related U.S. Application Data

(60) Provisional application No. 60/658,785, filed on Mar. 4, 2005.

(51) Int. Cl.
*G11C 8/00* (2006.01)

(52) U.S. Cl. .............................. 365/230.06; 365/189.06; 365/189.11

(58) Field of Classification Search ............. 365/230.06, 365/189.03, 189.11, 189.06
See application file for complete search history.

(56) References Cited

U.S. PATENT DOCUMENTS

| | | | |
|---|---|---|---|
| 5,864,508 A * | 1/1999 | Takashima et al. ...... | 365/189.11 |
| 6,147,914 A | 11/2000 | Leung et al. | |
| 6,744,676 B2 * | 6/2004 | Leung et al. ........... | 365/189.09 |

* cited by examiner

*Primary Examiner*—J. H. Hur
*Assistant Examiner*—Hien N Nguyen
(74) *Attorney, Agent, or Firm*—Duane Morris LLP

(57) ABSTRACT

A word line control device has a word line driver for deactivating and activating a word line to control access to a memory cell, and a voltage coupling device for coupling voltages to the word line driver. The word line control device maintains boosted voltages and has significantly reduced leakage currents and power consumption in the active and standby modes.

28 Claims, 17 Drawing Sheets

LOW POWER WORD LINE CONTROL CIRCUITS WITH BOOSTED VOLTAGE OUTPUT FOR SEMICONDUCTOR MEMORY

RELATED APPLICATIONS

This application claims the benefit of U.S. Provisional Application No. 60/658,785, filed Mar. 4, 2005. The entire disclosure of U.S. Provisional Application No. 60/658,785 is incorporated herein by reference.

FIELD OF INVENTION

The present invention relates to control of memory systems. More specifically, the present invention relates to word line control circuits for semiconductor memories that provide boosted voltages on word lines and reduce standby leakage.

BACKGROUND OF THE INVENTION

FIGS. 1A and 1B are schematic diagrams respectively showing a conventional VSSB coupling device 10 and a conventional word line driver 20. The VSSB coupling device 10 and the word line driver 20 may be used in a conventional word line driver system (not shown). Such a driver system typically utilizes a plurality of VSSB coupling devices 10 and a plurality of word line drivers 20. The VSSB coupling devices 10 and word line drivers 20 are arranged so that each VSSB coupling device supplies VSSB voltages to a select group of the word line drivers 20.

The VSSB coupling device 10 of FIG. 1A includes P-channel transistors 101, 102, and 103, an N-channel transistor 104 and inverters 111, 112, 113, and 114. The VSSB coupling device 10 is capable of coupling a negative boosted voltage VBB (e.g. −0.35 volts) or a ground supply voltage VSS (e.g., 0 volts) to its associated group of word line drivers 20.

The word line driver 20 of FIG. 1B includes P-channel transistors 201 and 202 and N-channel transistors 203, 204 and 205. The sources of N-channel transistors 204 and 205 are separately coupled to VSS and the source of N-channel transistor 203 is coupled to VSSB input terminal 207. The P-channel transistor 201 and N-channel transistor 203 form a last stage of the word line driver 20. The last stage ultimately controls access to memory cells (e.g. DRAM, SRAM, etc.) coupled to a word line WL by deactivating and activating the word line WL. To deactivate the word line WL, the P-channel transistor 201 is turned on, thereby pulling the word line WL up to a boosted positive word line voltage VPP (e.g., 1.5 volts) applied at VPP input terminal 206. To activate word line WL, the N-channel transistor 203 is turned on, thereby pulling down word line WL to the boosted negative voltage VBB applied at the VSSB terminal 207.

When one of the word lines WL controlled by the group of the word line drivers 20 is selected for access, the gates of the N-channel transistors 203 of the unselected word line drivers 20 in the group are biased at VSS and their corresponding sources are coupled to VBB. Hence in each of the unselected word line drivers 20, a significant sub-threshold current, caused by a positive cross voltage $V_{GS}$ (equal to VSS-VBB) between the gate and source of the N-channel transistor 203, will form a current path from VPP to VBB. This results in a voltage level drop in VPP for the unselected word lines WL controlled by the unselected word line drivers 20 and voltage level shallow in VBB for the selected word line.

In a standby state, when none of the word lines in the group of word lines have been selected, the P-channel transistors 201 of the word line drivers 20 are turned on and the N-channel transistors 203 of the word line drivers 20 are turned off, as shown in FIG. 1C (shows only the last stage of one of the word line drivers 20). The turned on P-channel transistors 201 couple their word lines WL to receive the boosted positive voltage VPP and the associated VSSB coupling device 10 is switched to couple or output the ground supply voltage VSS at VSSB output terminal 109 to the word line drivers 20. Thus, node N1 is maintained at VBB by P-channel transistor 102 and output terminal 109 is coupled to VSS by N-channel transistor 104, thereby creating a non-zero gate-source cross voltage VGS at P-channel transistor 101, which causes a leakage current from VSS to VBB.

In addition, in the standby state, a high cross voltage VDS (equal to VPP-VSS) exists between the source and drain of the last stage N-channel transistor 203 of each of the word line driver 20. This cross voltage causes significant sub-threshold channel leakage, possibly pulling down the VPP level, if VPP pump driving capability is poor. Further, the large number of the word line drivers 20 in each group (e.g., 32 word line drivers) in the standby state consume excessive power. These conditions are aggravated during high temperature operation.

Moreover, when one of the word lines WL is selected for access, the gate of the N-channel transistor 104 of the associated VSSB coupling device 10 is biased at VSS. Hence, a significant sub-threshold current, caused by a positive gate-source cross voltage $V_{GS}$ where $V_{GS}$ is the cross bias between node N2 and VSSB in FIG. 1A according to the definition of source node at which majority carriers emit. Accordingly, VGS=VSS−VBB>0 for selected word line condition resulting in a voltage level drop in VBB in the selected word line WL. Consequently, the selected (activated) word line may not reach its desired VBB level. Since VBB is a negative voltage level, a weakly conducted N-channel transistor 104 will make VBB voltage level "shallower" or closer to the ground supply voltage VSS through the N-channel transistor 104.

Accordingly, there is a need for a word line control circuit that maintains boosted voltages and has significantly reduced leakage currents and power consumption in the active and standby modes.

DETAILED DESCRIPTION

Figure 1A:
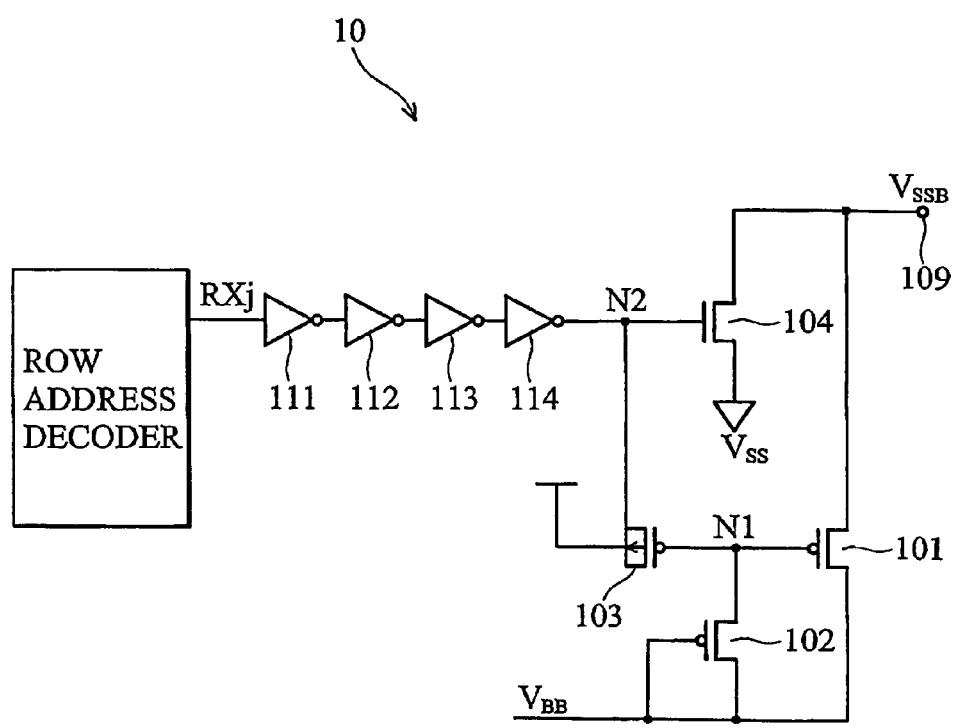
FIG. 1A is a schematic diagram of an exemplary prior art VSSB coupling device.
Figure 1B:
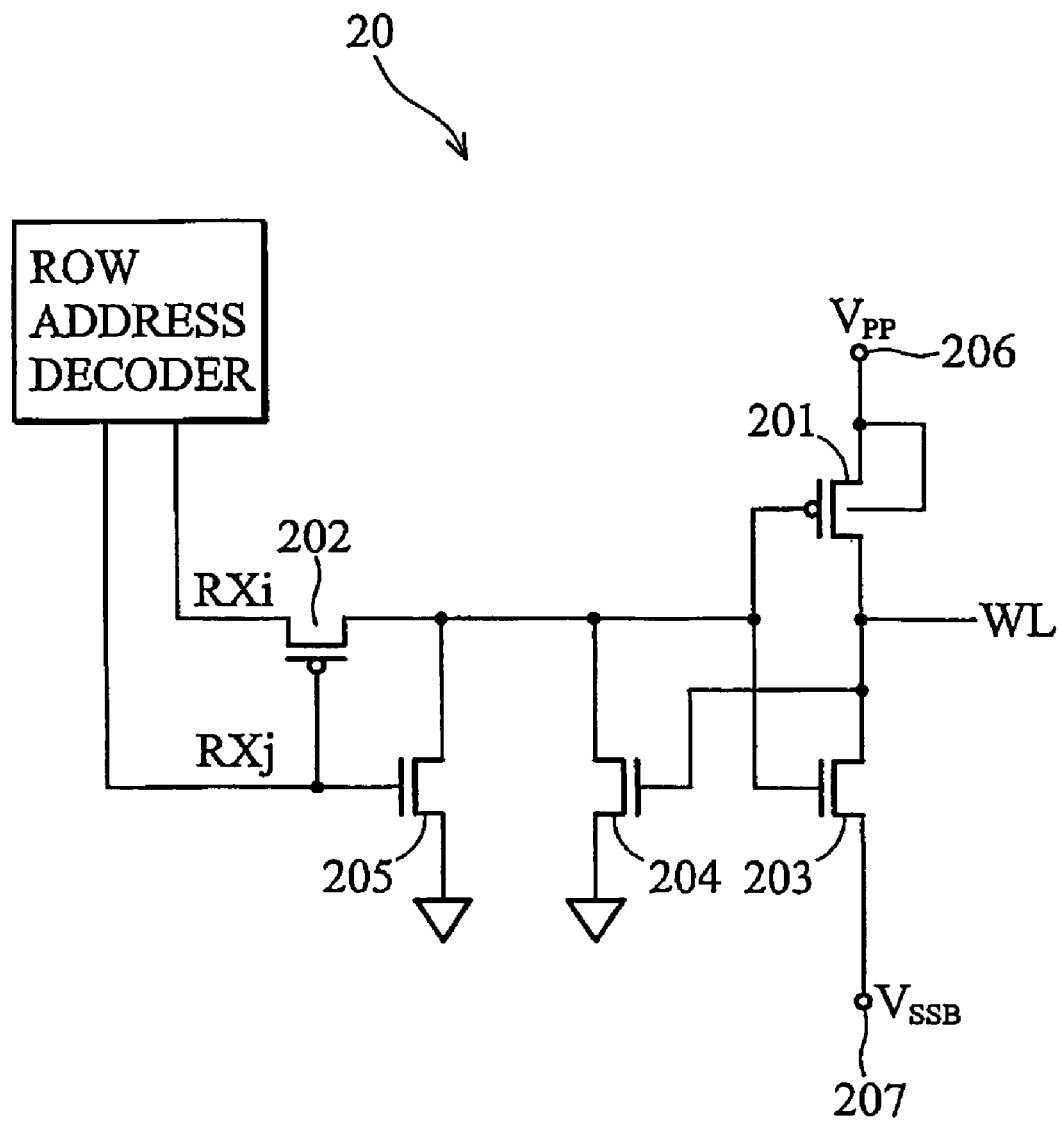
FIG. 1B is a schematic diagram of an exemplary prior art word line driver.
Figure 1C:
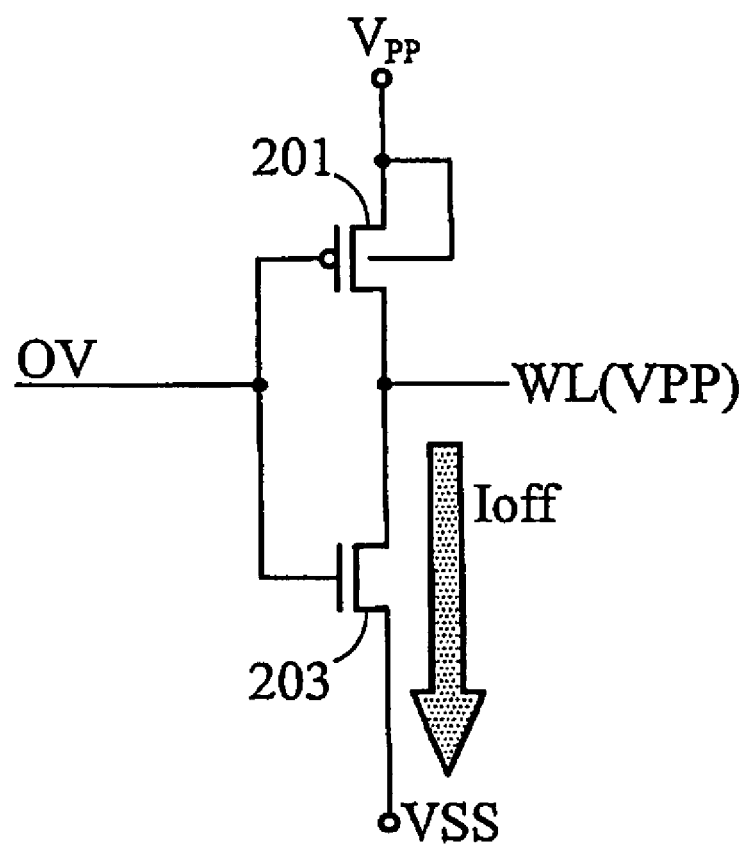
FIG. 1C is a schematic diagram of the last stage of the word line driver of FIG. 1B in a standby state.
Figure 2A:
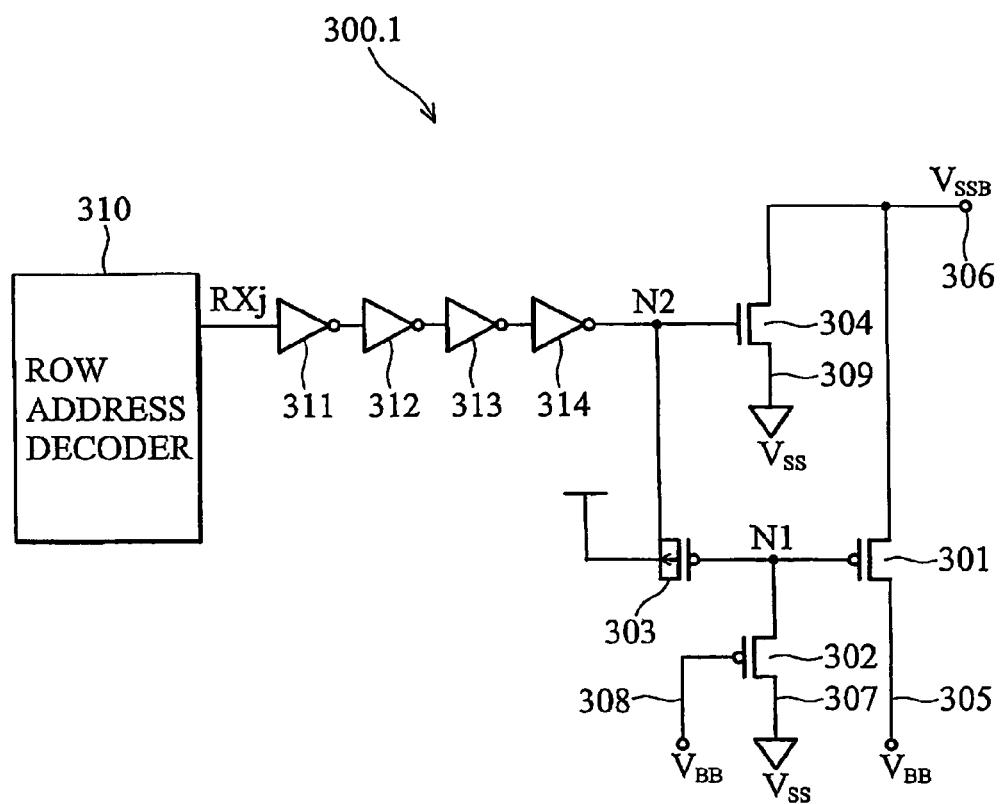
FIG. 2A is a schematic diagram of a VSSB coupling device according to a first embodiment of the present invention.

FIG. 2A is a schematic diagram of a VSSB coupling device according to a first embodiment of the present invention, denoted by numeral 300. The VSSB coupling device 300.1 includes a row address decoder 310, P-channel transistors 301, 302, and 303, an N-channel transistor 304 and inverters 311, 312, 313, and 314. The inverters 311-314 are coupled in series, with inverter 311 receiving an RXj signal from the row address decoder 310, and inverter 314 providing a delayed RXj signal to node N2. The P-channel transistor 301 is coupled between a VBB supply line 305 and a VSSB output terminal 306. The P-channel transistor 301 has a gate coupled to node N1. The P-channel transistor 302 is coupled between node N1 and a VSS supply line 307. The gate of the P-channel transistor 302 is coupled to a VBB supply line 308. The P-channel transistor 303 is coupled as a capacitor, having a source and a drain commonly coupled to node N2, and a gate coupled to node N1. The N-channel transistor 304 is coupled between a VSS supply line 309 and the VSSB output terminal 306.

The VSSB coupling device 300.1 couples either the VSS voltage line 309 or the VBB voltage line 305 to the VSSB output terminal 306 to output a VSSB voltage level equal to VSS or VBB respectively, wherein in one embodiment, VBB may be −0.35 volts and VSS may be 0 volts.

Figure 4A:
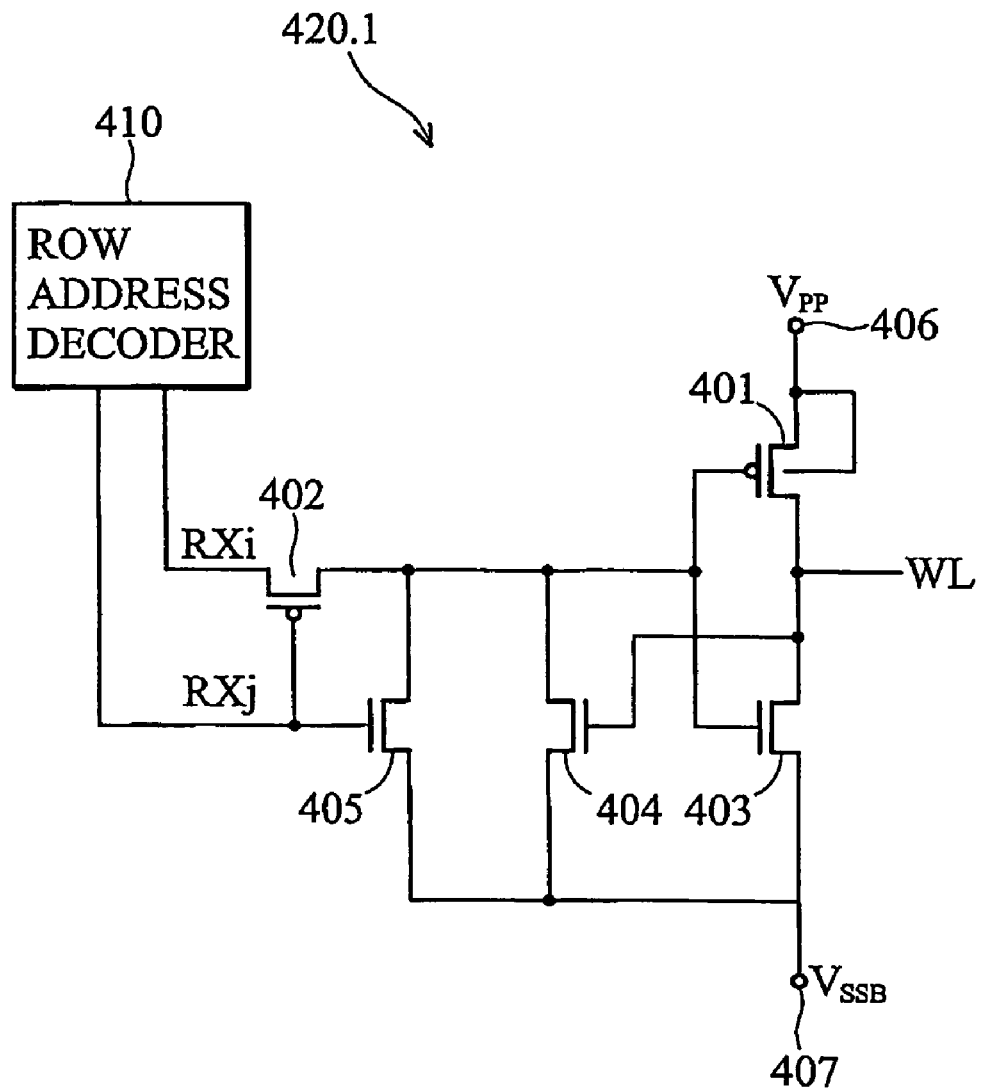
FIG. 4A is a schematic diagram of a word line driver according to a first embodiment of the present invention.

FIG. 4A is a schematic diagram of a word line driver 420.1 according to a first embodiment of the present invention. The word line driver 420.1 includes P-channel transistors 401 and 402 and N-channel transistors 403, 404 and 405. The P- and N-channel transistors 401 and 403 are coupled between VPP input terminal 406 and VSSB input terminal 407. The P- and N-channel transistors 401 and 403 have gates that are commonly connected to a pass gate formed by the P-channel transistor 402. When turned on, the P-channel transistor 402 allows the gates of the P- and N-channel transistors 401 and 403 to receive the RXi signal provided by a row address decoder 410. The P-channel transistor 402 has a gate that is coupled to receive the RXj signal from the row address decoder 410. The N-channel transistor 405 is coupled between the VSSB input terminal 407 and the gates of the P- and N-channel transistors 401 and 403. The N-channel transistor 405 has a gate that is coupled to receive the RXJ signal. The N-channel transistor 404 is also coupled between the VSSB input terminal 407 and the gates of the P- and N-channel transistors 401 and 403. The N-channel transistor 404 has a gate that is coupled to the word line WL. The P-channel transistor 401 and N-channel transistor 403 form a last stage of the driver circuit 420.1. The last stage ultimately controls access to memory cells (e.g. DRAM, SRAM, etc.) coupled to word line WL by deactivating and activating the word line WL.

Figure 3A:
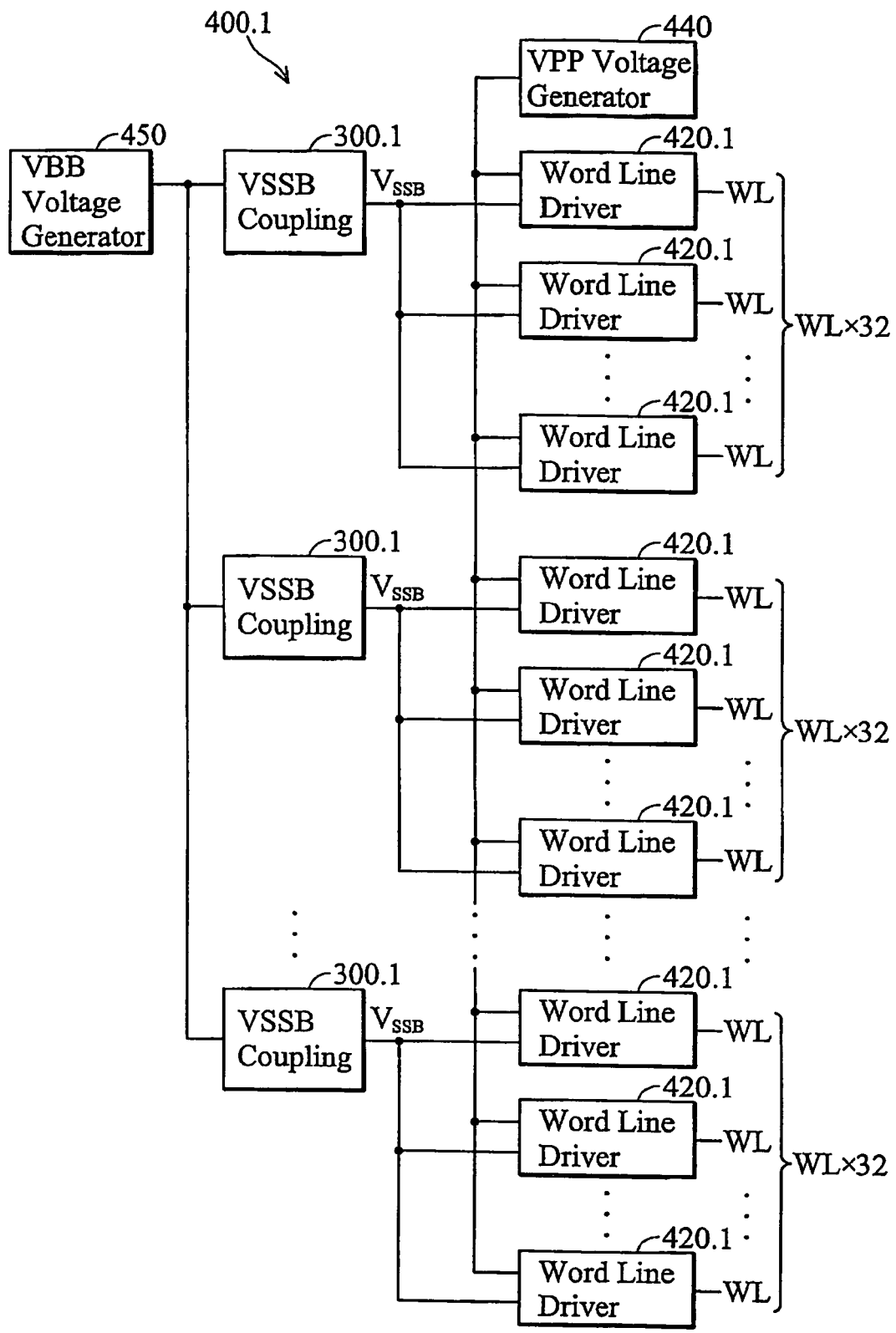
FIG. 3A is a block diagram of a word line driver system according to a first embodiment of the present invention.

The VSSB coupling device 300.1 of FIG. 2A and the word line driver 420.1 of FIG. 4A may be utilized in the word line driver system 400.1 of FIG. 3A. The word line driver system 400.1 may include a plurality of the VSSB coupling devices 300.1, a plurality of the word line drivers 420.1, a VPP voltage generator 440, and a VBB voltage generator 450. The VSSB coupling devices 300.1 are each coupled to an associated group of word line drivers 420.1 (e.g., 32 word line drivers in the shown embodiment). Each of the VSSB coupling devices 300.1 is operated to couple the VBB voltage generator 450 to its associated group of word line drivers 420.1 when one or more of the word lines associated with the group is/are to be turned on. When none of the word lines in the group are to be turned on, the associated VSSB coupling device 300.1 is operated to couple the VSS voltage to its group of word line drivers 420.1.

Figure 5:
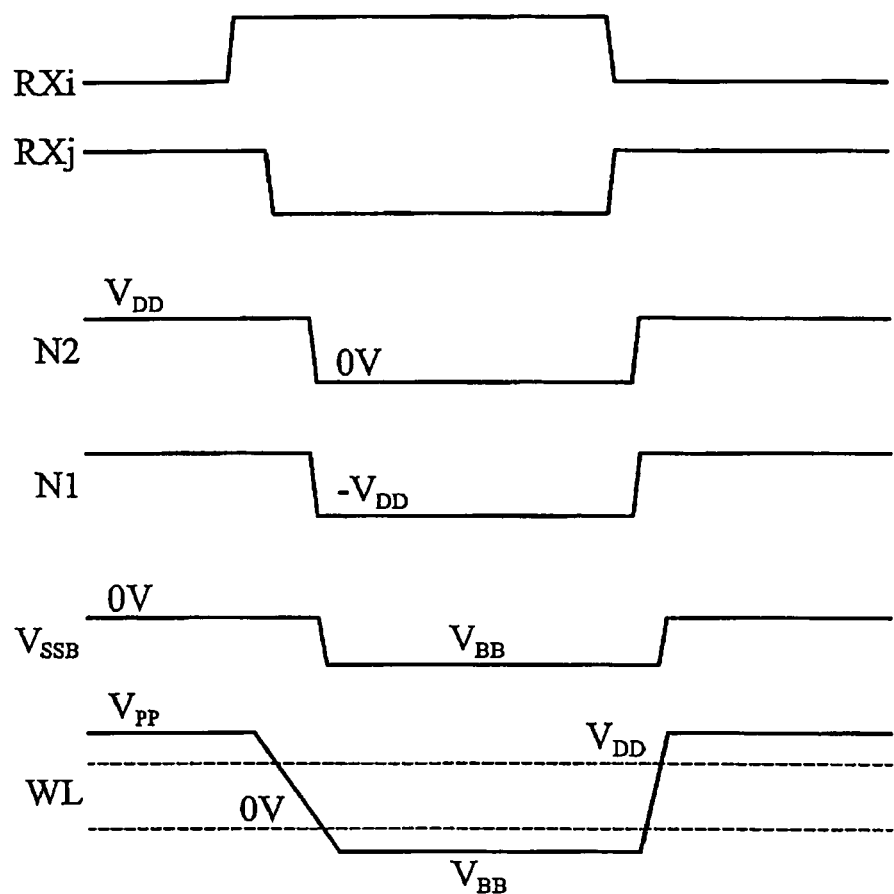
FIG. 5 is a waveform diagram showing various signals generated during the operation of the word line driver system of FIG. 3A.

The operation of the VSSB coupling device 300.1 of FIG. 2A will now be described in conjunction with FIG. 5, which is a waveform diagram showing various signals generated during the operation of the word line driver system 400.1 of FIG. 3A. In a standby state when none of the word lines in a group of word lines is being accessed, the VSSB coupling device 300.1 associated with the group is switched to couple the VSS voltage line 309 to the VSSB output terminal 306 to output VSS. This is achieved by turning on the N-channel transistor 304 and turning off the P-channel transistor 301. This occurs when the row address decoder 310 outputs a high voltage RXj signal that propagates through inverters 311-314, providing a high voltage at node N2 which turns on the N-channel transistor 304 and couples the VSS supply line 309 to the VSSB output terminal 306. The high voltage at node N2, pulls the source and drain of the capacitor-coupled P-channel transistor 303 to a high state. Because the P-channel transistor 302 is coupled to the VSS supply line 307, the P-channel transistor 302 limits the voltage at node N1 to a voltage approximately equal to VSS, thereby turning off the P-channel transistor 301 and initially charging, the capacitor-coupled P-channel transistor 303 to a voltage approximately equal to supply voltage VDD at node N2, (VDD may be a positive voltage less than VPP, e.g., 1.2 volts for 0.13 um technology, 1.5 volts for 0.15 um technology, etc.). Since node N1 and the VSSB output terminal 306 are both at VSS in the standby state, the gate-source cross voltage VGS at the P-channel transistor 301 is 0 volts, i.e., VSS-VSS. Thus, current leakage from VSS to VBB is substantially eliminated, and VSS is maintained at the VSSB output terminal 306.

When one of the word lines WL is selected for access, the VBB voltage line 305 is coupled to the VSSB output terminal 306 by turning off the N-channel transistor 304 and turning on the P-channel transistor 301. More specifically, the row address decoder 310 outputs a low state or voltage RXj signal which propagates through inverters 311-314. When the low state of the RXj signal reaches node N2, the N-channel transistor 304 is turned off, thereby shutting off the VSS voltage supply line 309 from the VSSB output terminal 306. The low state RXj signal at node N2 causes the capacitor-coupled P-channel transistor 303 to pull node N1 down to a voltage equal to −VDD (e.g., −1.2 volts) which turns on the P-channel transistor 301 and couples the VBB voltage supply line 305 to the VSSB output terminal 306.

Figure 8A:
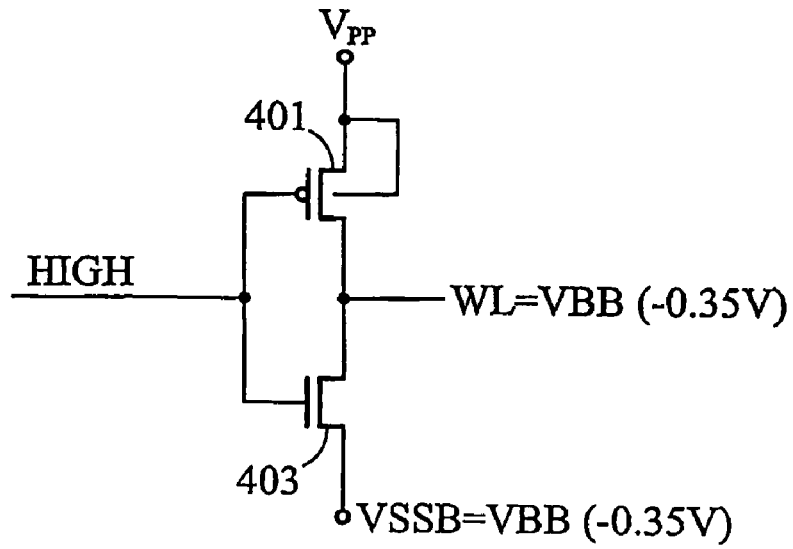
FIG. 8A is a schematic diagram of the last stage of the word line driver in an active state.

The operation of the word line driver 420.1 of FIG. 4A will now be described in conjunction with the waveform diagram of FIG. 5. When memory cells (e.g., DRAM, SRAM, etc.)

connected to a word line WL are selected for access, the row address decoder 410 of the associated word line driver 420.1 first outputs a high voltage RXi signal, and then outputs a low RXj signal. The low voltage state of the RXj signal turns on the P-channel transistor 402 and turns off the N-channel transistor 405 of the associated word line driver 420.1, thereby providing the high voltage RXi signal to the gates of the word line driver's P- and N-channel transistors 401 and 403. Under these conditions, as shown in FIG. 8A, the P-channel transistor 401 is turned off and N-channel transistor 403 is turned on, thereby pulling the selected word line WL down to VBB applied at the VSSB input terminal 407 of the word line driver 420.1 by its associated VSSB coupling circuit 300.1, which is switched to output VBB, as described above. Since the gate of the N-channel transistor 404 is coupled to the word line, which is at a voltage level of −0.35 volts (VBB), the N-channel transistor 404 is turned off. The gates and sources of the N-channel transistors 403 of the word line drivers 420.1 in the group that are associated with the unselected word lines WL are biased at VBB, because the sources of the N-channel transistors 403 (off), 404 (on), and 405 (on) of the unselected word line drivers 420.1 are coupled to the VSSB input terminal 407, which is at VBB.

Figure 8B:
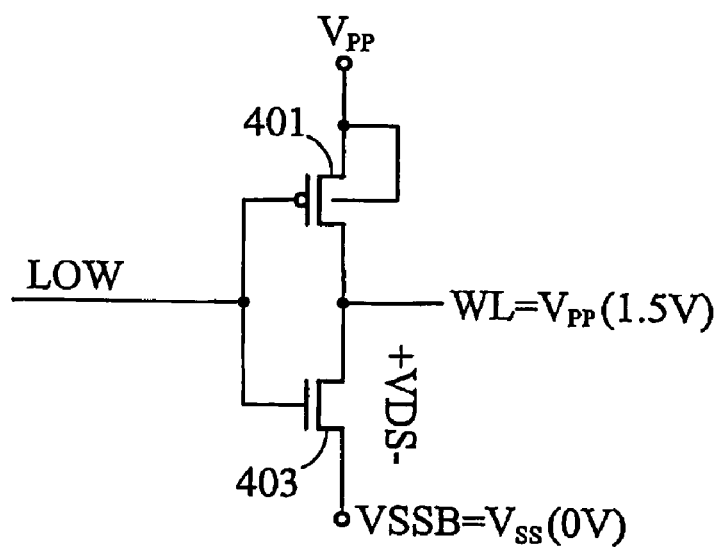
FIG. 8B is a schematic diagram of the last stage of the word line driver in a standby state.

In a standby state, i.e., when none of the word lines WL in the group of word lines are being accessed, and the associated VSSB coupling circuit 300.1 is switched to output VSS, which is applied to the VSSB input terminals 407 of the group of word line drivers 420.1, the row address decoders 410 of the group output a high voltage RXj signal, thereby turning on their N-channel transistors 405, turning off their P-channel transistors 402 and turning on the N-channel transistors 404. The turned on N-channel transistors 405 couple the gates of the P- and N-channel transistors 401 and 403 to the VSSB input terminals 407, which are at VSS. Under these conditions, as shown in FIG. 8B, the P-channel transistors 401 are turned on, thereby pulling the word lines WL up to the VPP provided at the VPP input terminals 406, and the N-channel transistors 403 are turned off. The VSS applied to all the sources of the N-channel transistors 403, 404, 405 of the word line drivers 420.1 in the standby state eliminates the gate-source cross bias VGS (VSS-VSS) on the last stage N-channel transistors 403. This, in turn, reduces by several orders of magnitude the leakage current that emanates from the sub-threshold channel of the N-channel transistors 403, especially at high temperatures, which can cause lowering of VPP if the VPP voltage generator is insufficient. Hence, power consumption may be reduced by suppressing the sub-threshold leakage of the N-channel transistors 403 in the "off" state.

Figure 8C:
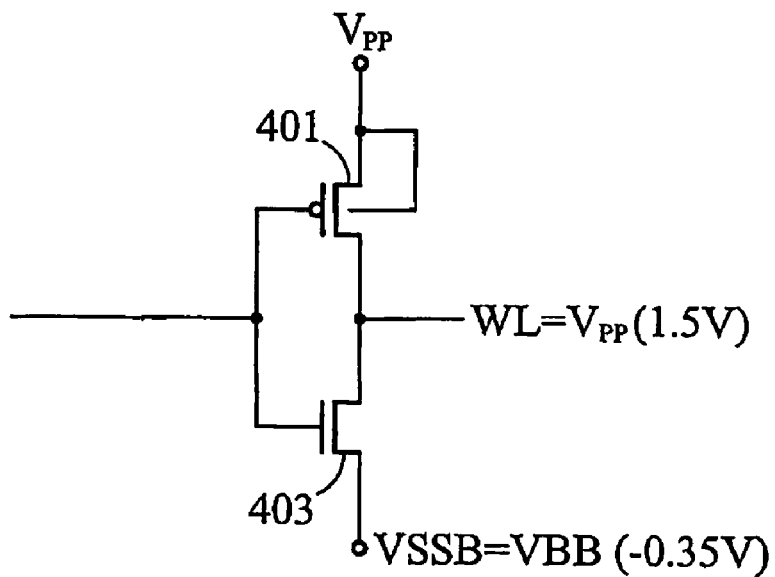
FIG. 8C is a schematic diagram of the last stage of the word line driver in a standby state when an associated word line driver is selected to be in an active state.

FIG. 8C shows the last stage of a word line driver 420.1 in a standby state when an associated word line driver 420.1 is selected to be in an active state. Under this condition the corresponding VSSB coupling circuit 300.1 is switched to output VBB, which is applied to the VSSB input terminal 407 of the word line drivers 420.1 in the standby state. The P-channel transistors 401 of the word line drivers 420.1 in the standby state are turned on thereby pulling the word lines WL up to the VPP provided at the VPP input terminals 406, and the N-channel transistors 403 are turned off.

Figure 2B:
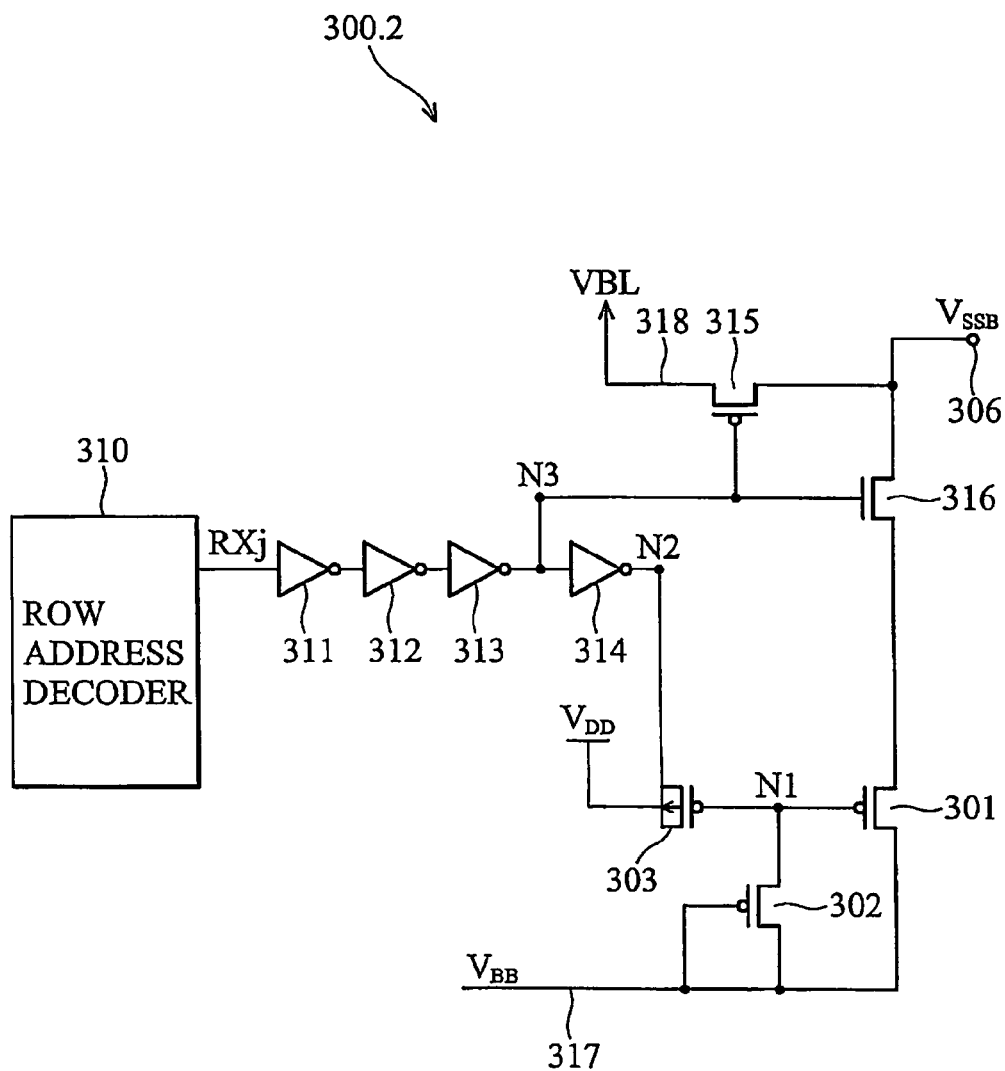
FIG. 2B is a schematic diagram of a VSSB coupling device according to a second embodiment of the present invention.
Figure 3B:
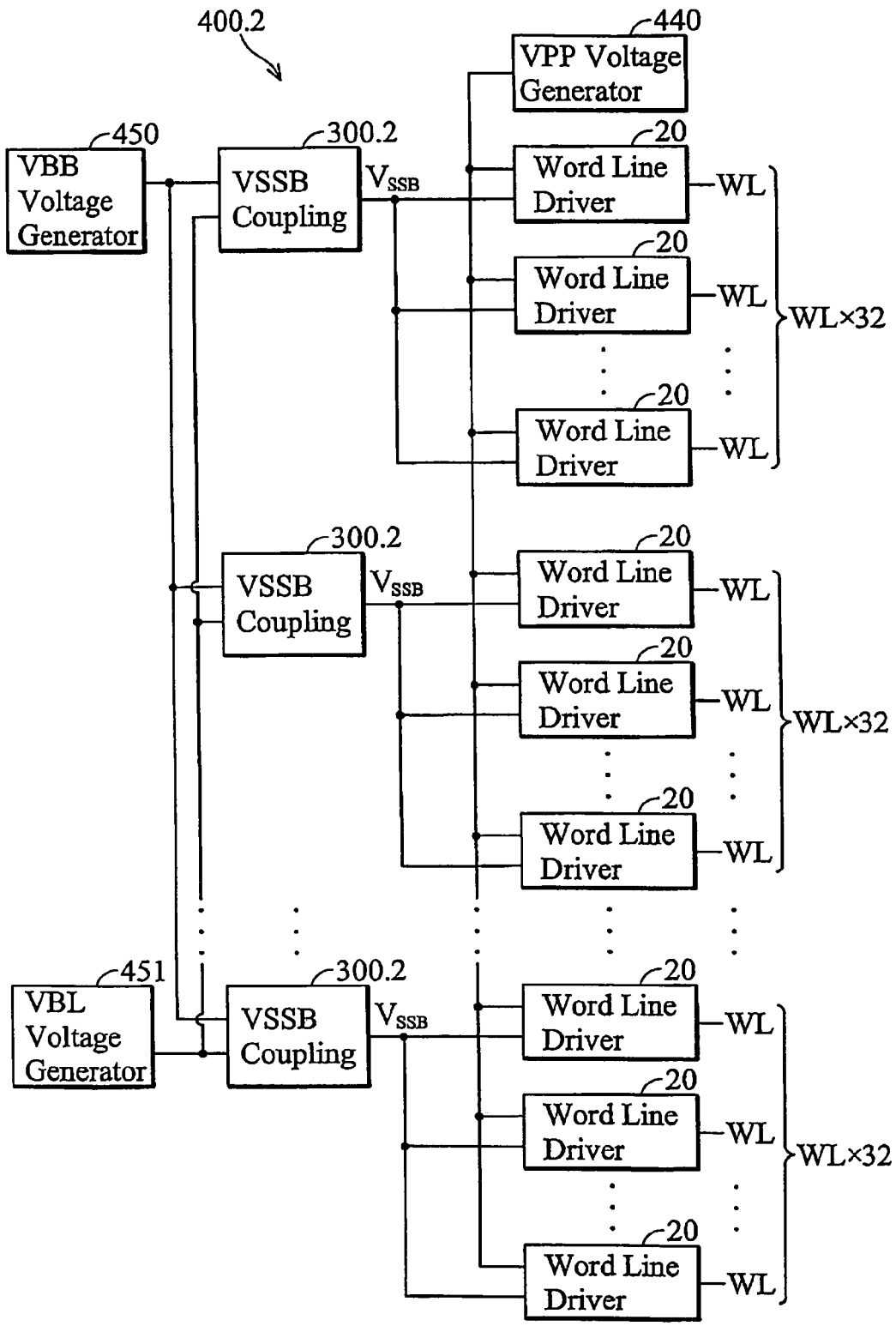
FIG. 3B is a block diagram of a word line driver system according to a second embodiment of the present invention.

FIG. 2B is a schematic diagram of a VSSB coupling device 300.2 according to a second embodiment of the present invention, where like elements identify like parts. The VSSB coupling device 300.2 includes a row address decoder 310, P-channel transistors 301, 302, 303, and 315, an N-channel transistor 316 and inverters 311, 312, 313, and 314. The inverters 311-314 are coupled in series, with inverter 311 receiving an RXj signal from the row address decoder 310, and inverter 313 providing a first delayed RXj signal to node N2 and inverter 314 providing a second delayed RXj signal to node N2. The P-channel transistor 301 is coupled between a boosted negative voltage VBB supply line 317 and the N-channel transistor 316. The P-channel transistor 301 has a gate coupled to node N1. The P-channel transistor 302 is coupled between node N1 and the VBB voltage supply line 317. The P-channel transistor 303 is coupled as a capacitor, having a source and a drain commonly coupled to node N2, and a gate coupled to node N1. The P-channel transistor 315 is coupled between a boosted ground supply voltage VBL supply line 318 (which may be coupled to a VBL voltage generator 451, as shown in FIG. 3B) and a VSSB output terminal 306. The N-channel transistor 316 is coupled between the VBL voltage supply line 317 and the P-channel transistor 301. The gates of the P-channel transistor 315 and N-channel transistor 316 are coupled to node N3.

The VSSB coupling device 300.2 couples either the VBL voltage line 318 or the VBB voltage line 317 to the VSSB output terminal 306 to output a VSSB voltage level equal to VBL or VBB respectively, wherein VBL is greater than ground supply voltage VSS and less than boosted positive voltage VPP. In one embodiment, VBL may be 0.6 volts, VBB may be −0.35 volts, VPP may be 1.5 volts and VSS may be 0 volts.

Coupling of the VBL voltage line 318 to the VSSB output terminal 309 may be achieved by turning on the P-channel transistor 315 and turning off the N-channel transistor 316. More specifically, the row address decoder 310 outputs a high voltage RXj signal that propagates through inverters 311-313, first providing a high voltage at node N3 which turns on the P-channel transistor 315 and turns off the N-channel transistor 316. The RXj signal continues through inverter 314 providing a high voltage at node N2, pulling the source and drain of the capacitor-coupled P-channel transistor 303 to a high state. The P-channel transistor 302 is connected as a MOS diode with its gate and drain connected to the VBB supply line 317. Therefore, the P-channel transistor 302 limits the voltage at node N1 to a voltage approximately equal to VSS, thereby turning off the P-channel transistor 301 and initially charging, the capacitor-coupled P-channel transistor 303 to a voltage approximately equal to VSS or VBB for longer time period. Thus, under these conditions, the VBL supply line 318 is coupled to the VSSB output terminal 306 to output a VSSB voltage level of VBL.

Coupling of the VBB voltage line 317 to the VSSB output terminal 306 may be accomplished by turning off the P-channel transistor 315 and turning on the N-channel transistor 316. More specifically, the row address decoder 310 outputs a low state or voltage RXj signal which propagates through inverters 311-313. Prior to reaching node N3, the P-channel transistor 315 is on, coupling the VSSB output terminal to the VBL supply line 318 and node N2 is in a high state coupling node N1 to a voltage approximately equal to VSS, thereby turning off the P-channel transistor 301. When the low state of the RXj signal reaches node N3, the P-channel transistor 315 is turned off, thereby de-coupling the VBL voltage supply line 318 from the VSSB output terminal 306 and the N-channel transistor 316 is turned on. Then, when the low state RXj signal subsequently reaches node N2, the capacitor-coupled P-channel transistor 303 pulls node N1 down to a voltage equal to −VDD, which turns on the P-channel transistor 301 and couples the VBB voltage supply line 317 to the VBBS output terminal 306.

The second embodiment of the VSSB coupling device 300.2 may be used in the word line driver system 400.2 of FIG. 3B, where like numerals identify like elements. Specifically, when memory cells (e.g., DRAM, SRAM, etc.) connected to word line WL are selected for access, the row address decoder 410 of the associated word line driver 20 first outputs a high voltage RXi signal, and then outputs a low RXj signal. The low voltage state of the RXj signal turns on the P-channel transistor 402 and turns off the N-channel transistor 405 of the associated word line driver 20, thereby providing the high voltage RXi signal to the gates of the corresponding P- and N-channel transistors 401 and 403. Under these conditions, as shown in FIG. 8A, the N-channel transistor 403 is turned on, thereby pulling the selected word line WL down to VBB provided at the VSSB input terminal 407 of the selected word line driver 20 by its associated VSSB coupling circuit 300.2, which is switched to output VBB, as described above. Since gate voltage of the associated N-channel transistor 404 is obtained from word line WL level which now at VBB, the N-channel transistor 404 is turned off.

Figure 8D:
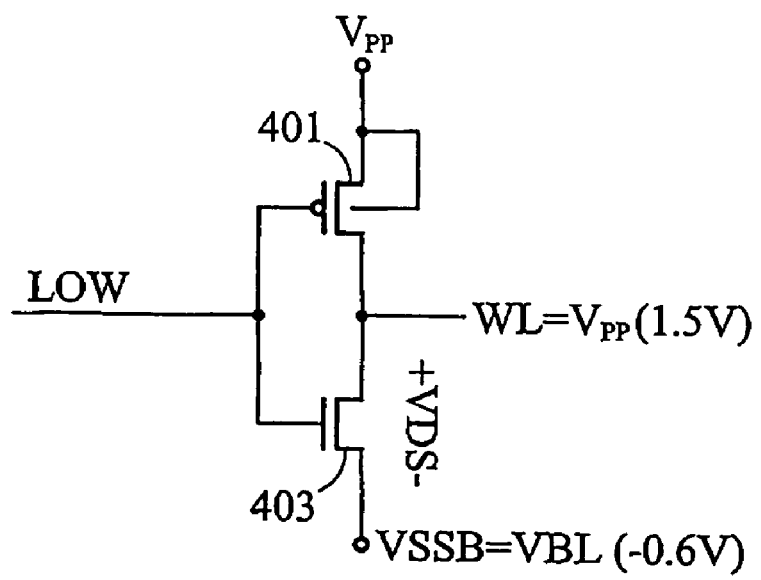
FIG. 8D is a schematic diagram of the last stage of the word line driver in a standby state.

In a standby state, i.e., when none of the word lines in the group of word lines are being accessed, the row address decoders 410 of the group of word line drivers 20 output a high voltage RXj signal, thereby turning on the N-channel transistors 405 and turning off the P-channel transistors 402. The turned on N-channel transistors 405 couple the gates of the P-and N-channel transistors 401 and 403 to VSS. Under these conditions, as shown in FIG. 8D, the P-channel transistors 401 are turned on, thereby pulling the word lines WL up to the VPP provided at the VPP input terminals 406, and the N-channel transistors 403 are turned off. The N-channel transistors 404 are turned on by the VPP word line WL voltage level. At about the same time, the associated VSSB coupling device 300.2 is switched to output VBL, which is applied to the VBBS input terminals 407. The VBL applied to the VBBS input terminals 407 of the word line drivers 20 in the standby state reduces the drain-source cross bias VDS (VPP-VBL) on the last stage N-channel transistors 403. This, in turn, reduces by several orders of magnitude the leakage current that emanates from the subthreshold channel of the N-channel transistors 403, especially at high temperatures, which can cause lowering of VPP if the VPP voltage generator is insufficient. Hence, power consumption may be reduced by suppressing the sub-threshold leakage of the N-channel transistors 403 in the "off" state.

In addition to reducing the sub-threshold leakage of the N-channel transistors 403 of the word line drivers 420.2 in the off state, the VBBS coupling device 300.2 also avoids the significant sub-threshold current issues of the prior art, caused by a positive gate-source cross voltage $V_{GS}$ which may drop the voltage level of VBB in the selected word line WL.

Figure 2C:
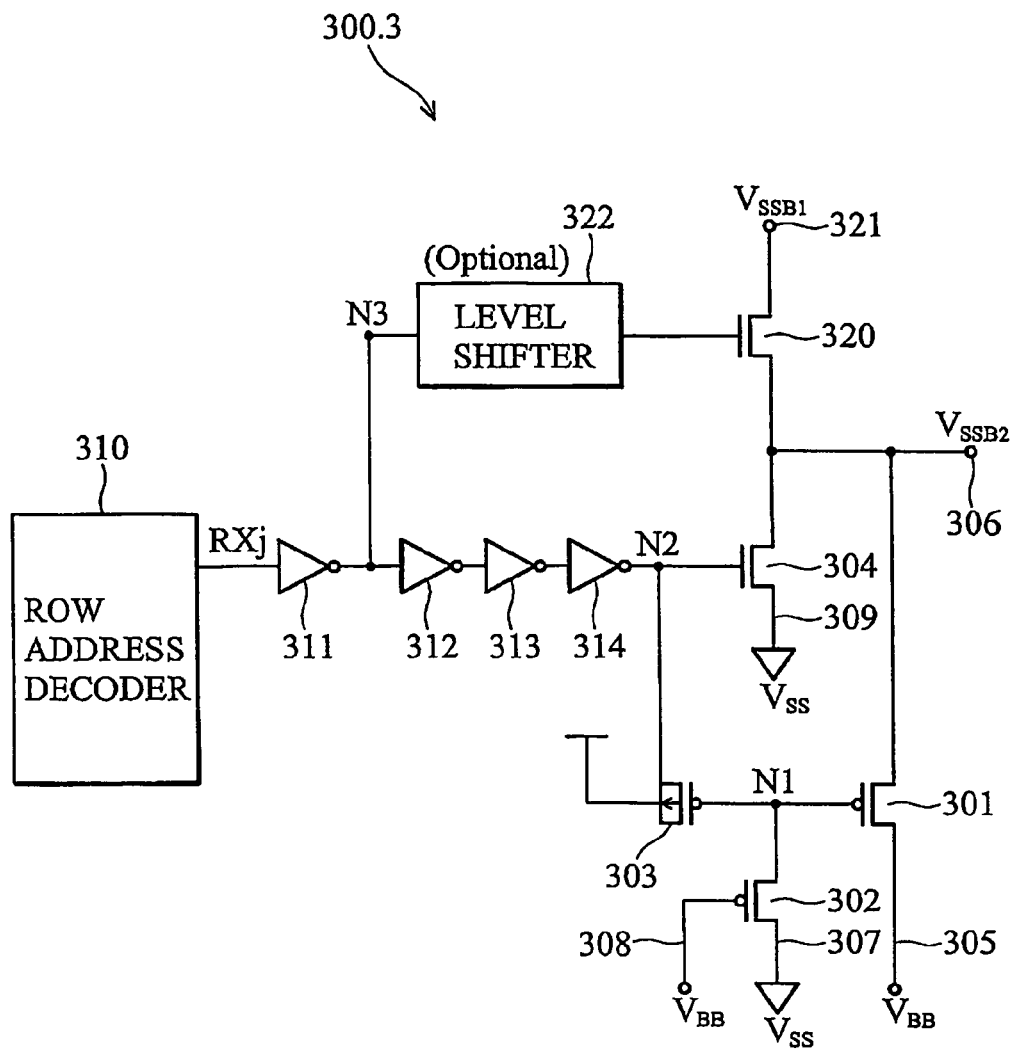
FIG. 2C is a schematic diagram of a VSSB coupling device according to a third embodiment of the present invention.

FIG. 2C is a schematic diagram of a VSSB coupling device 300.3 according to a third embodiment of the present invention where like numerals identify like elements. The VSSB coupling device 300.3 includes a row address decoder 310, P-channel transistors 301, 302, and 303, N-channel transistors 320 and 304 and inverters 311, 312, 313, and 314. The inverters 311-314 are coupled in series, with inverter 311 receiving an RXj signal from the row address decoder 310 and providing a first delayed RXj signal to node N3 and inverter 314 providing a second delayed RXj signal to node N2. The N-channels transistors 320 and 304 are coupled between VSSB output terminal 321 (VSSB1) and VSS supply line 309. The N-channel transistor 320 has a gate coupled to node N3 and the N-channel transistor 304 has a gate coupled to node N2. An optional level shifter 322 may be coupled between the node N3 and the gate of the N-channel transistor 320 if a negative voltage is utilized to turn off the transistor 320. The P-channel transistor 301 is coupled between VBB supply line 305 and VSSB output terminal 306 (VSSB2). The VSSB output terminal 306 is also coupled between N-channel transistor 304 and N-channel transistor 320. The P-channel transistor 301 has a gate coupled to node N1. The P-channel transistor 302 is coupled between node N1 and VSS supply line 307. The P-channel transistor 302 has a gate coupled to VBB supply line 308. The P-channel transistor 303 is coupled as a capacitor, having a source and drain commonly coupled to node N2, and a gate coupled to node N1.

Figure 4B:
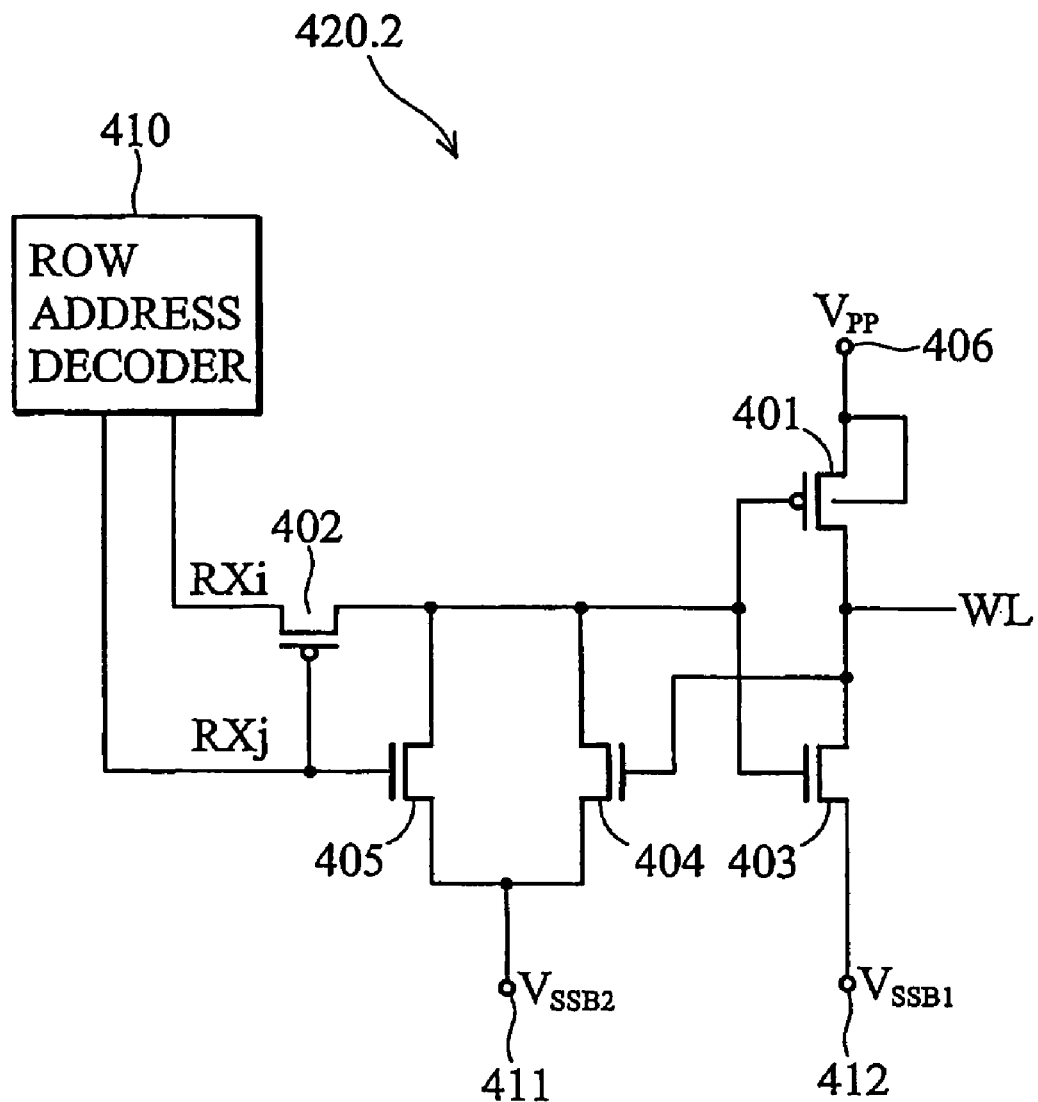
FIG. 4B is a schematic diagram of a word line driver according to a second embodiment of the present invention.

FIG. 4B is a schematic diagram of a word line driver 420.2 according to a second embodiment of the present invention, where like numerals identify like elements. The word line driver 420.2 includes P-channel transistors 401 and 402 and N-channel transistors 403, 404 and 405. The P- and N-channel transistors 401 and 403 are coupled between VPP input terminal 406 and VSSB input terminal 412 (VSSB1). The P- and N-channel transistors 401 and 403 have gates that are commonly connected to a pass gate formed by the P-channel transistor 402. When turned on, the P-channel transistor 402 allows the gates of the P- and N-channel transistors 401 and 403 to receive the RXi signal provided by the row address decoder 410. The P-channel transistor 402 has a gate that is coupled to receive the RXj signal from the row address decoder 410. The N-channel transistors 404 and 405 are coupled between VSSB input terminal 411 (VSSB2) and the gates of the P- and N-channel transistors 401 and 403. The N-channel transistor 405 has a gate that is coupled to receive the RXJ signal. The N-channel transistor 404 has a gate that is coupled to the word line WL.

Figure 3C:
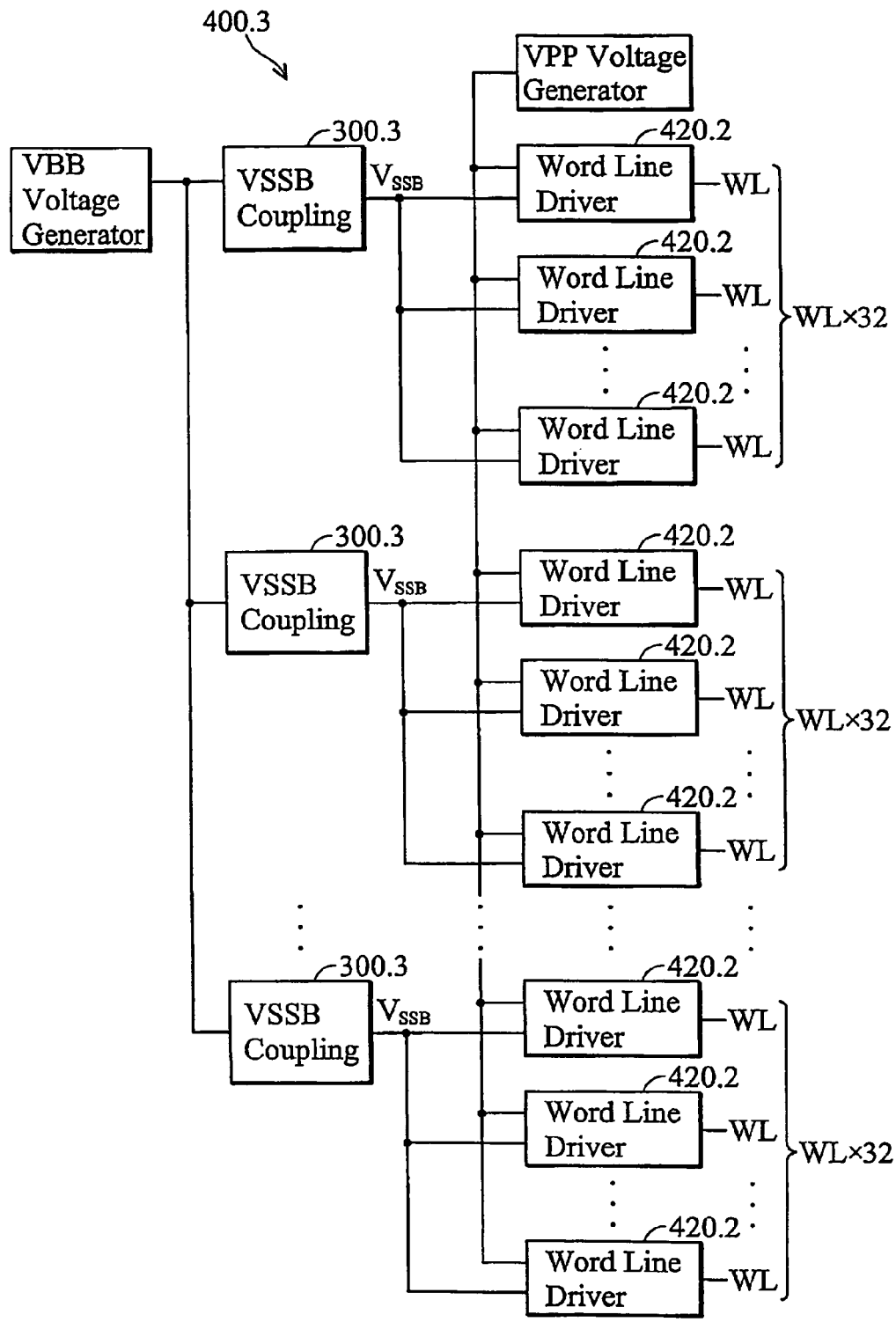
FIG. 3C is a block diagram of a word line driver system according to a third embodiment of the present invention.
Figure 7A:
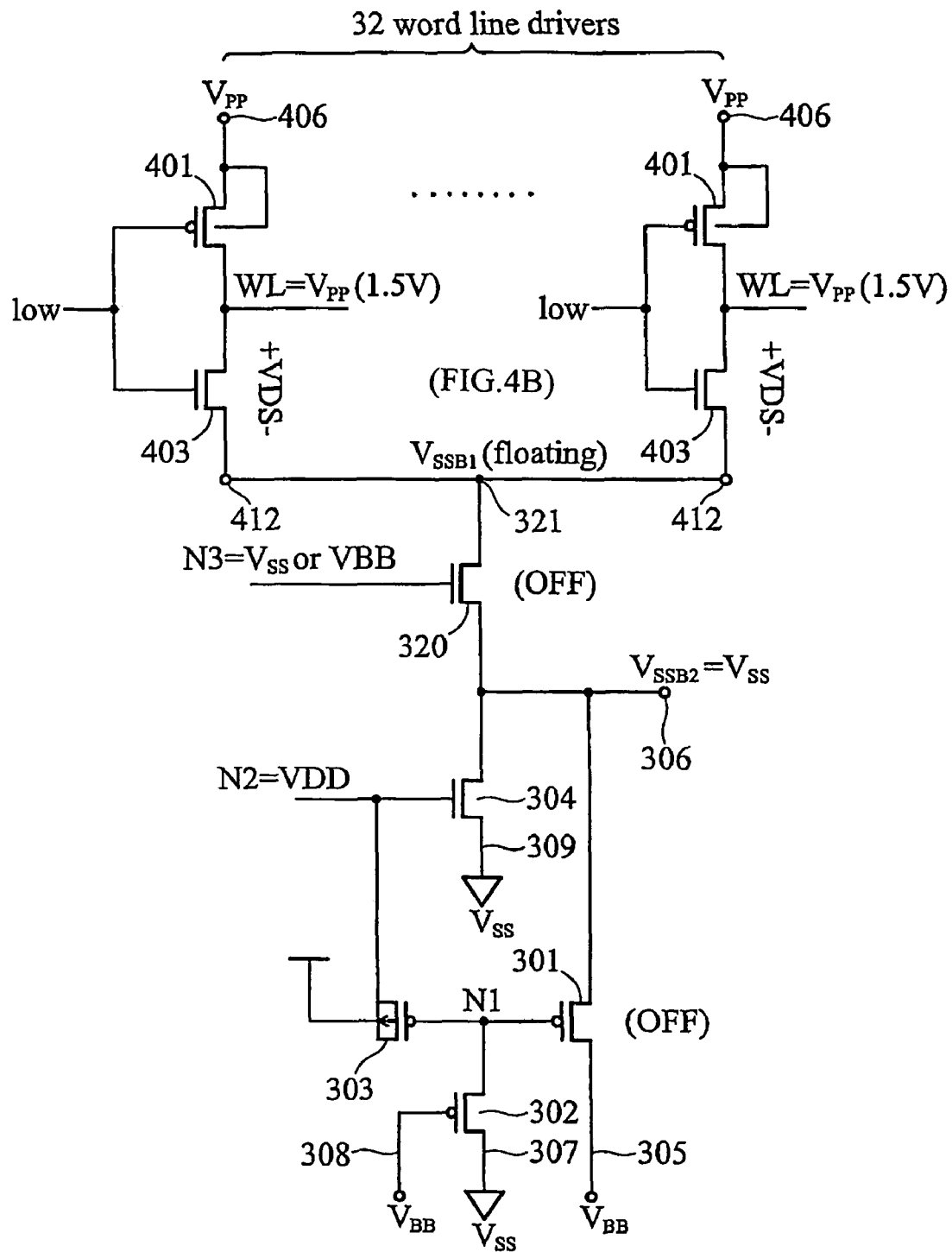
FIG. 7A is a schematic diagram of the last stages of a plurality of FIG. 4B word line drivers and an associated FIG. 2C VSSB coupling device in a standby state.

The word line driver 420.2 may be used with the VSSB coupling device 300.3 in a third embodiment of the word line driver system 400.3 shown in FIG. 3C. In the standby state, as shown in FIG. 7A, the total "off" current leaking from each group of word line drivers 420.2 is limited by the N-channel transistor 320 disposed in the VBBS1 path, when the N-channel transistor 320 is turned off by applying VSS or a negative voltage e.g., VBB, to the gate of the N-channel transistor 320. Since each VSSB coupling device 300.3 serves multiple word line drivers 420.2 simultaneously, e.g., 32 in the shown embodiment of FIG. 3C, the total leakage of these drivers 420.2 in the standby state depends only upon the size and gate bias of the N-channel transistor 320.

Figure 6:
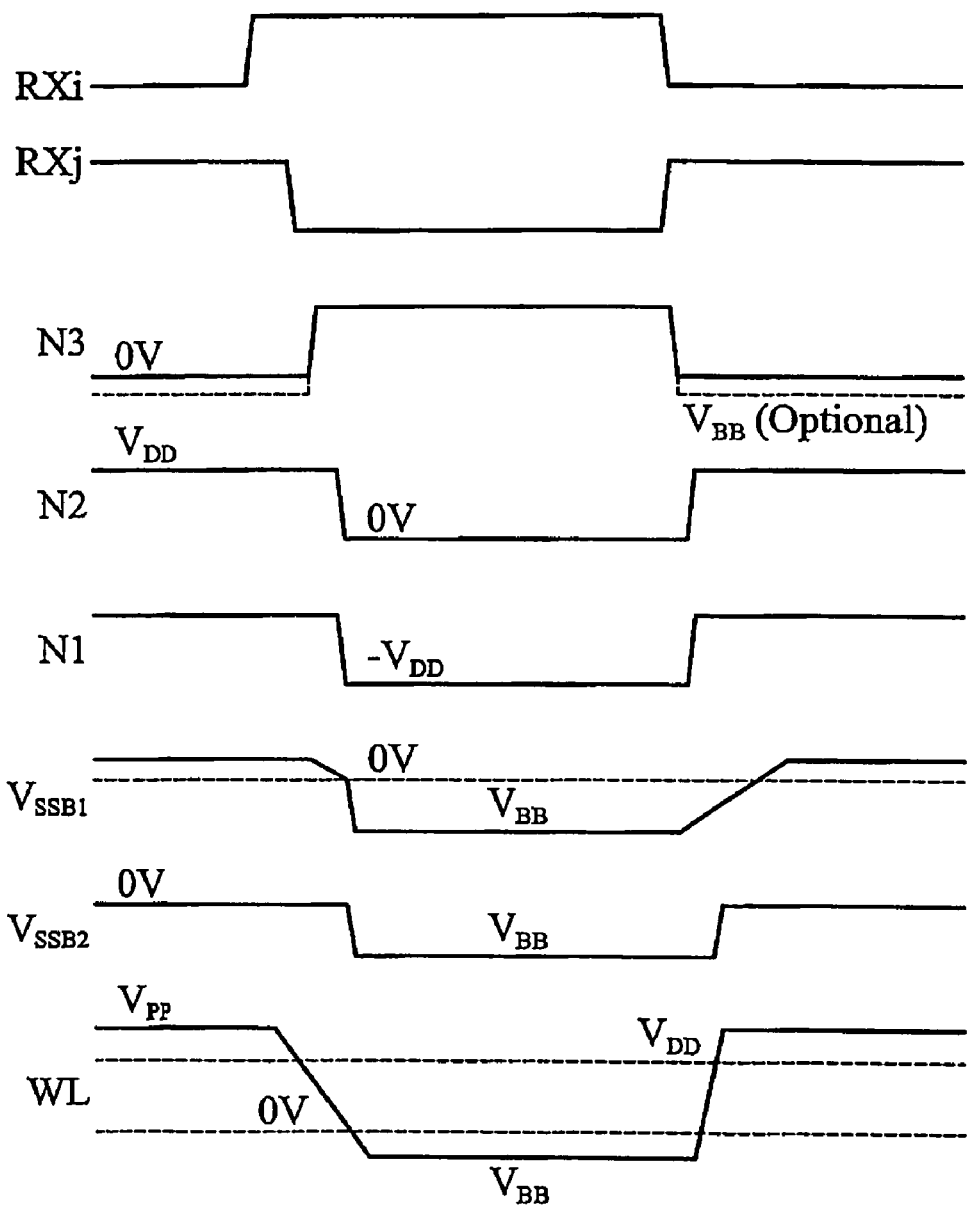
FIG. 6 is a waveform diagram showing various signals generated during the operation of the word line driver system of FIG. 3C.

FIG. 6 is a waveform diagram showing various signals generated during the operation of the word line driver system 400.3 of FIG. 3C. During the standby state (prior to activating word line WL), the RXi signal is at a low voltage and the RXj signal is at a high voltage. Under these conditions, as shown collectively in FIGS. 2C, 4B, and 7A, inverter 311 places node N3 at VSS, thereby turning off N-channel transistor 320 and inverters 311-314 place node N2 at VDD, which turns on N-channel transistor 304. Meanwhile, P-channel transistor 301 is turned off due to node N1 being pulled to VSS by P-channel transistor 302, thus, VSSB2 output terminal 306 is maintained at VSS. However, N-channel transistor 320 is turned off and N-channel transistor 304 is also turned off during the standby state, so that the voltage at VSSB1 node 321 or node 412 (FIG. 4B) floats, for example, between VSS and VPP to minimize leakage through N-channel transistors 403 and 320. The VSSB2 output terminal 306 is maintained at VSS, as it is coupled to the VSS supply line 309 through the turned on N-channel transistor 304. Accordingly, the VSSB1 input terminal 412 and the VSSB2 input terminal 411 of the associated word line drivers 420.2 are maintained at voltages higher than VSS and VSS, respectively. Since, the P-channel transistors 401 are turned on and N-channel transistors are turned off in the last stage of the word line drivers 420.2 in the standby state, the word lines WL are at VPP.

The voltage higher than VSS applied to the VSSB1 input terminal 412 of the word line driver 420.2 in the standby state reduces the drain-source cross bias VDS on the last stage N-channel transistor 403, which in turn, reduces the sub-threshold channel leakage current that emanates from of the N-channel transistors 403 of the wordline drivers 420.2, especially at high temperatures, which can cause lowering of VPP, if the VPP generator 440 is insufficient. Hence, power consumption is reduced in the standby state.

Figure 7B:
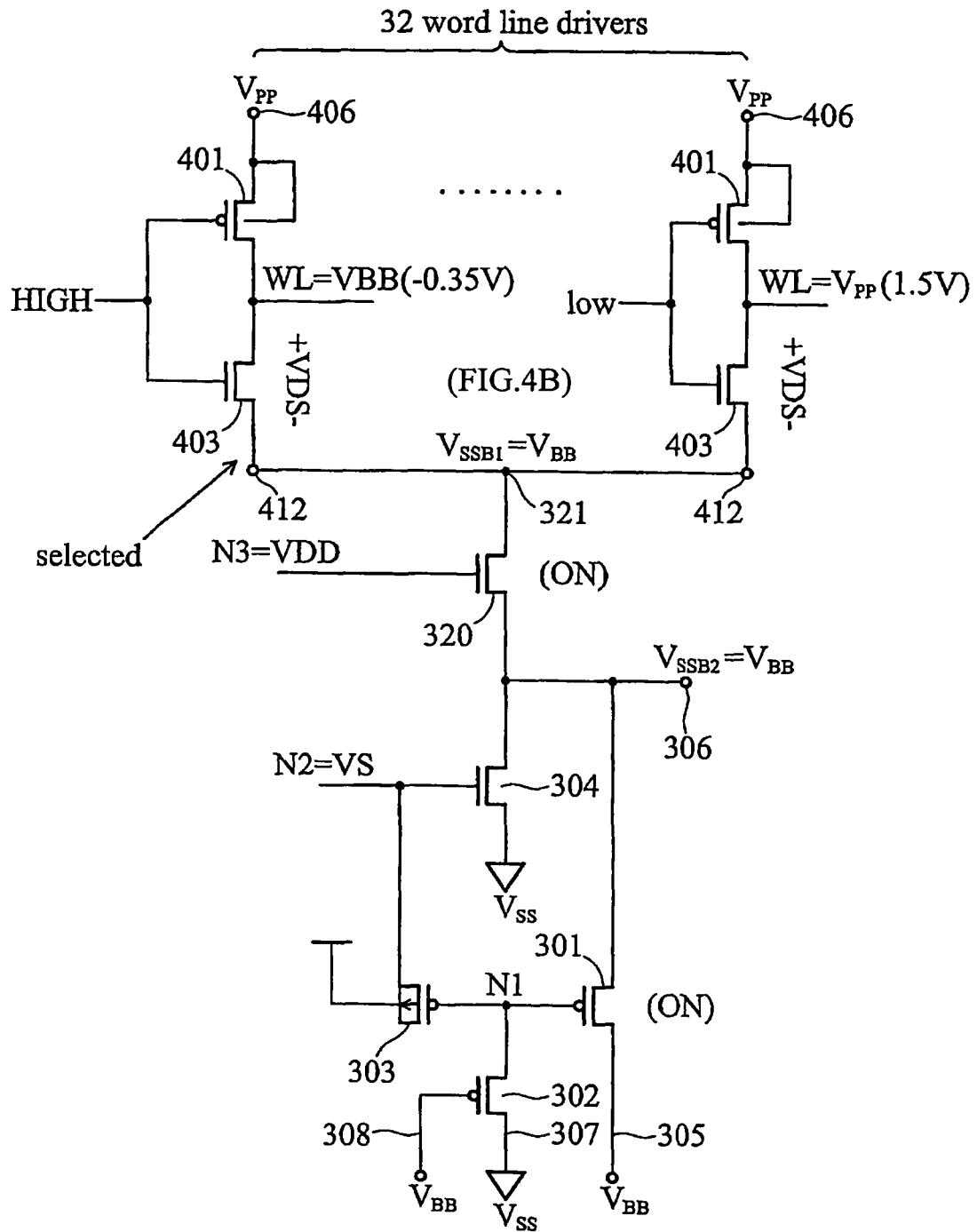
FIG. 7B is a schematic diagram of the last stages of a plurality of FIG. 4B word line drivers and an associated FIG. 2C VSSB coupling device in an active state.

Still referring to FIG. 6, when it is desired to select one of the word lines WL for activation, the RXi signal is driven to a high voltage and then the RXj signal is driven to a low voltage to activate the selected word line WL. Under these conditions, as shown collectively in FIGS. 2C, 4B, and 7B, the N-channel transistor 403 of the word line driver 420.2 of the selected word line WL turns on (and the P-channel transistor 401 turns off), thereby coupling the word line WL to the VSSB input terminal 410. Immediately after the N-channel transistor 403 is turned on, the low voltage RXj signal propagating through inverter 311 pulls node N3 up to VDD, thereby turning on the N-channel transistor 320. The low voltage RXj signal propagating through inverters 311-314 then pulls node N2 down to VSS, thereby turning off N-channel transistor 304 and de-coupling the VSS supply line 309 from the VSSB output terminals 321 and 306. The low voltage at node N2 causes the capacitor-coupled P-channel transistor 303 to pull node N1 down to −VDD, which then, turns on the P-channel transistor 301, thereby coupling the VBB supply line 305 to the VBBS2 output terminal 306 and coupling the VBB supply line 305 to the VBBS1 output terminal 321 through the turned on N-channel transistor 320. Consequently, the VSSB1 output terminal 321 is pulled from a voltage higher than VSS down to VBB and the VSSB2 output terminal 306 is pulled from VSS down to VBB. The VBB voltages at the VSSB output terminals 321 and 306 are respectively applied to the VSSB input terminals 410 and 411 of the associated word line drivers 420.2. Appropriate switching of the transistors 402, 404 and 405 of the word line driver 420.2 corresponding to the selected word line WL turns off that driver's last stage P-channel transistor 401 and turns on that driver's N-channel transistor 403 to pull down the selected word line WL to VBB.

While the foregoing invention has been described with reference to the above, various modifications and changes can be made without departing from the spirit of the invention. Accordingly, all such modifications and changes are considered to be within the scope of the appended claims.

What is claimed is:

1. A word line control device comprising:
a word line driver for deactivating and activating a word line to control access to a memory cell, the word lined driver comprising:
a first transistor for activating the word line when the first transistor is turned on; and
a second transistor for turning off the first transistor;
wherein a source or drain of the first transistor and a source or drain of the second transistor are coupled to a common voltage input terminal.

2. The word line control device of claim 1, wherein the word line driver further includes a third transistor coupled to the common voltage input terminal, the third transistor turning off when the word line is activated.

3. The word line control device of claim 2, wherein the first, second and third transistors are of an N-channel type.

4. The word line control device of claim 1, wherein the word line driver outputs a boosted positive voltage and a boosted negative voltage.

5. The word line control device of claim 4, wherein the boosted positive voltage is greater than a supply voltage.

6. The word line control device of claim 4, wherein the boosted negative voltage is less than a ground supply voltage.

7. The word line control device of claim 2, further comprising a voltage coupling device coupled to the common voltage input terminal.

8. The word line control device of claim 7, wherein the voltage coupling device comprises:
a first voltage supply line for supplying a ground supply voltage;
a second voltage supply line for supplying a boosted negative voltage;
a voltage output terminal for outputting one of the ground supply and boosted negative voltages; and
a fourth transistor coupled between the voltage output terminal and boosted negative voltage supply line;
wherein turning off the fourth transistor allows the ground supply voltage supplied by the first voltage supply line to be routed to the voltage output terminal.

9. he word line control device of claim 8, wherein the voltage coupling device further comprises a fifth transistor for applying the ground supply voltage to the gate of the fourth transistor.

10. The word line control device of claim 9, wherein the voltage coupling device further comprises a third voltage supply line coupled to the fifth transistor, the third voltage supply line supplying the ground supply voltage for the gate of the fourth transistor.

11. The word line control device of claim 7, wherein the word line driver outputs a boosted positive voltage and a boosted negative voltage.

12. The word line control device of claim 11, wherein the boosted positive voltage is greater than a supply voltage.

13. The word line control device of claim 12, wherein the boosted negative voltage is less than a ground supply voltage.

14. A word line control device comprising:
a voltage coupling device comprising:
a first voltage supply line for supplying a ground supply voltage;
a second voltage supply line for supplying a boosted negative voltage;
a voltage output terminal for outputting one of the ground supply and boosted negative voltages; and
a transistor coupled between the voltage output terminal and boosted negative voltage supply line;
wherein turning off the transistor allows the ground supply voltage supplied by the first voltage supply line to be routed to the voltage output terminal.

15. A word line driver comprising:
a first transistor for activating the word line when the first transistor is turned on; and
a second transistor for turning off the first transistor;
wherein a source or drain of the first transistor and a source or drain of the second transistor are coupled to a common voltage input terminal.

16. A voltage coupling device comprising:
a first voltage supply line for supplying a ground supply voltage;
a second voltage supply line for supplying a boosted negative voltage;
a voltage output terminal for outputting one of the ground supply and boosted negative voltages; and
a transistor coupled between the voltage output terminal and boosted negative voltage supply line;
wherein turning off the transistor allows the ground supply voltage supplied by the first voltage supply line to be routed to the voltage output terminal.

17. A word line control device comprising:
a word line driver for deactivating and activating a word line to control access to a memory cell, the word line driver including a voltage input terminal; and
a voltage coupling device coupled to the voltage input terminal of the word line driver, the voltage coupling device comprising:
a first voltage supply line for supplying a boosted ground supply voltage;
a second voltage supply line for supplying a boosted negative voltage;
a voltage output terminal for outputting one of the boosted ground supply and boosted negative voltages to the input terminal of the word line driver; and
a pair of transistors for selectively coupling one of the first and second voltage supply lines to the voltage output terminal.

18. The word line control device according to claim 17, wherein the transistors comprise:
a first transistor coupled between the voltage output terminal and boosted negative voltage supply line; and
a second transistor coupled between the boosted ground supply line and the voltage output terminal.

19. The word line control device of claim 18, wherein the voltage coupling device further comprises a third transistor coupled between the voltage output terminal and boosted negative voltage supply line.

20. The word line control device of claim 18, wherein the first transistor is of an N-channel type and the second transistor is of a P-channel type.

21. The word line control device of claim 20, wherein the first and second transistors each include a gate, the gates commonly connected to a node.

22. The word line control device of claim 17, wherein one of the pair of transistors is of an N-channel type and the other one of the pair of transistors is of a P-channel type.

23. The word line control device of claim 17, wherein the pair of transistors each include a gate, the gates commonly connected to a node.

24. The word line control device of claim 17, wherein the word line driver outputs a boosted positive voltage, a boosted negative voltage, and a boosted ground supply voltage.

25. The word line control device of claim 24, wherein the boosted positive voltage is greater than a ground supply voltage and the boosted ground supply voltage.

26. The word line control device of claim 24, wherein the boosted negative voltage is less than a ground supply voltage.

27. A voltage coupling device comprising:
a first voltage supply line for supplying a boosted ground supply voltage;
a second voltage supply line for supplying a boosted negative voltage;
a voltage output terminal for outputting one of the boosted ground supply and boosted negative voltages to an input terminal of a word line driver; and
a pair of transistors for selectively coupling one of the first and second voltage supply lines to the voltage output terminal.

28. A word line control device comprising:
a voltage coupling device comprising:
a first voltage supply line for supplying a boosted ground supply voltage;
a second voltage supply line for supplying a boosted negative voltage;
a voltage output terminal for outputting one of the boosted ground supply and boosted negative voltages to an input terminal of a word line driver; and
a pair of transistors for selectively coupling one of the first and second voltage supply lines to the voltage output terminal.

* * * * *

UNITED STATES PATENT AND TRADEMARK OFFICE
CERTIFICATE OF CORRECTION

| | | |
|---|---|---|
| PATENT NO. | : 7,855,932 B2 | Page 1 of 1 |
| APPLICATION NO. | : 11/264041 | |
| DATED | : December 21, 2010 | |
| INVENTOR(S) | : Chung-Cheng Chou et al. | |

It is certified that error appears in the above-identified patent and that said Letters Patent is hereby corrected as shown below:

Column 10, Claim 9, Line 19, delete "he" and insert -- The -- therefor.

Signed and Sealed this
Fifteenth Day of February, 2011

David J. Kappos
*Director of the United States Patent and Trademark Office*